United States Patent [19]

Kaminow

[11] 4,400,813

[45] Aug. 23, 1983

[54] CRENELATED-RIDGE WAVEGUIDE LASER

[75] Inventor: Ivan P. Kaminow, Holmdel, N.J.

[73] Assignee: Bell Telephone Laboratories, Incorporated, Murray Hill, N.J.

[21] Appl. No.: 285,253

[22] Filed: Jul. 20, 1981

[51] Int. Cl.$^3$ ............................................. H01S 3/19
[52] U.S. Cl. ....................................... 372/45; 372/46
[58] Field of Search ...................... 372/19, 32, 45, 46, 372/48, 47, 96, 50

[56] References Cited

U.S. PATENT DOCUMENTS

| | | | |
|---|---|---|---|
| 3,760,292 | 9/1973 | Kogelnik et al. | 372/96 |
| 3,891,302 | 6/1975 | Dabby et al. | 350/96 |
| 4,257,011 | 3/1981 | Nakamura et al. | 372/48 |
| 4,375,686 | 3/1983 | de Waard | 372/45 |

OTHER PUBLICATIONS

Lasher, "Analysis of a Proposed Bistable Injection Laser," 1964, Solid-State Elect., vol. 7, pp. 707-716.
Nathan et al, "GaAs Injection Laser with Novel Mode Control and Switching Properties," Feb. 1965, J. Appl. Phys., vol. 36, No. 2, pp. 473-480.
Lee et al., "Repetitively Q-Switched Light Pulses from GaAs Injection Lasers with Tandem Double-Section Stripe Geometry," IEEE J. of Quant. Elect. vol. QE-6, No. 6, Jun. 1970, pp. 339-352.
Shubert, "Theory of Optical-Waveguide Distributed Lasers with Nonuniform Gain and Coupling," J. Appl. Phys. Jan. 1974, vol. 45, No. 1, pp. 209-216.
Doi et al., "InGaAsP/InP Distributed-Feedback Injection Lasers Fabricated by One-Step Liquid Phase Epitaxy," Sep. 15, 1979, Appl. Phys. Lett. vol. 35, No. 6, pp. 441-443.
de Waard, "A Novel Single Mode Laser Having Periodic Variations in the Stripe Width," Proceedings of Optical Comm. Conf., Amsterdam, Netherlands, Sep. 17-19, 1979, pp. 1-11.
Kaminow et al., "Single-Mode C. W. Ridge-Waveguide Laser Emitting at 1.55 pm, " Elect. Lett. vol. 15, No. 23, Nov. 8, 1979, pp. 73-74.

Primary Examiner—William L. Sikes
Assistant Examiner—Léon Scott, Jr.
Attorney, Agent, or Firm—D. D. Dubosky; S. Sherman

[57] ABSTRACT

The ridge-structure in a ridge waveguide laser is notched at periodic intervals to produce a longitudinally crenelated ridge, and the electrode on the ridge side of the laser is alloyed only to the topmost surfaces of the ridge. As a result, the active region of the laser is pumped only in the regions that are underneath the topmost surfaces of the ridge, and the laser is caused to prefer the longitudinal modes whose maxima coincide with the spatial Fourier components of the pumped regions.

8 Claims, 3 Drawing Figures

CRENELATED-RIDGE WAVEGUIDE LASER

TECHNICAL FIELD

This invention relates to semiconductor lasers and, more particularly, to semiconductor lasers that incorporate some means of longitudinal mode control.

BACKGROUND OF THE INVENTION

Single longitudinal mode operation of semiconductor lasers is a desirable property which can be obtained with distributed feedback structures as long as the feedback is obtained totally from the distributed structure and not from any cleaved end. Such lasers are disclosed in U.S. Pat. No. 3,675,157 issued July 4, 1972 to H. W. Kogelnik et al. Fabrication of distributed feedback lasers is difficult in some cases and their threshold currents have generally been found to be higher than for lasers with cleaved mirrors.

Another form of longitudinal mode control was disclosed by P. J. de Waard in his talk entitled "A Novel Single Mode Laser Having Periodic Variations in the Stripe Width ("Super DFB")" which was presented at the Optical Communications Conference in Amsterdam, Netherlands, Sept. 17–19, 1979. In the laser described by de Waard an electrode is used that has periodic stripe width variations in order to create a structure which is said to be similar to a succession of optical waveguides. In this way, de Waard states that he achieves a stable longitudinal mode behavior.

SUMMARY OF THE INVENTION

Longitudinal mode stabilization is achieved in accordance with the present invention wherein the ridge of a ridge waveguide laser is notched at periodic intervals along the entire length of the laser in order to create a crenelated structure over the active region. Contacts are alloyed only at the topmost points of the ridge and insulating material is coated elsewhere. The entire surface is then covered with an electrode. With this type of structure the laser is pumped at periodic spatial regions along the length of the laser, and the laser is permitted to operate only in the longitudinal modes whose amplitude maxima coincide with the pumped regions of the laser. The periodic ridge-loading encourages similar longitudinal mode selection.

DETAILED DESCRIPTION

The embodiment which was constructed in accordance with the present invention uses a ridge-type structure in order to achieve lateral mode confinement in a laser that operates at a wavelength of about 1.55 micrometers. A similar laser with a continuous ridge is disclosed in the article entitled "Single-Mode C.W. Ridge-Waveguide Laser Emitting At 1.55 µm," by I. P. Kaminow et al., *Electronics Letters*, Nov. 8, 1979, Vol. 15, No. 23, pp. 763–765. The laser constructed in accordance with the present invention is similar to the ridge-type laser in the Kaminow et al. article except that the ridge in accordance with the present embodiment is notched along the entire length in order to produce a crenelated-ridge structure.

Figure 2:
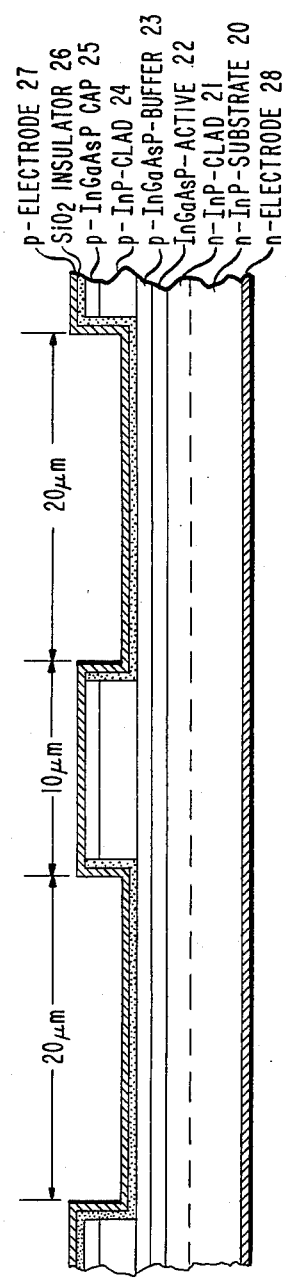
FIGS. 2 and 3 are cross sectional views of the semiconductor laser shown in FIG. 1.

Initially a multilayered liquid phase epitaxial structure is constructed by depositing an indium phosphide n-type cladding layer 21 on the <100> surface of an n-type indium phosphide substrate 20 as indicated in FIG. 2. An undoped indium gallium arsenide phosphide active layer 22 is then grown with a thickness of about 0.3 µm followed by a p-type indium gallium arsenide phosphide buffer layer 23 grown with a thickness of about 0.3 µm. The buffer layer is then followed by a p-type indium phosphide cladding layer 24 having a thickness of about 1 µm and a p-type indium gallium arsenide phosphide cap layer 25 grown with a thickness of about 0.5 µm. The lattice-matched quaternary active layer has a bandgap corresponding to 1.55 µm and the cap and buffer layers each have bandgaps of 1.13 µm. The grown p-type layers are zinc doped and the n-type layers are tin doped. Additional zinc is diffused into the cap layer 25 in order to increase its conductivity.

The crenelated ridge structure is then constructed by photolithographically creating a mask on the top surface of the wafer which has windows in all of the areas that are to be protected during an ion milling step that follows. Titanium is then deposited through these windows in the areas which will eventually correspond to the topmost regions of the crenelated-ridge structure. Ion milling is then used to erode away the cap layer in regions that are 20 micrometers wide on each side of the ridge structure and in the notches that are between the teeth of the crenelated-ridge structure. The mask is constructed so that a 10 micrometer wide ridge is notched along its length with a periodicity of 10 micrometers ($\Lambda$) thereby causing each tooth of the ridge to be 5 micrometers long and 10 micrometers wide with a spacing of 5 micrometers between adjacent teeth.

Figure 1:
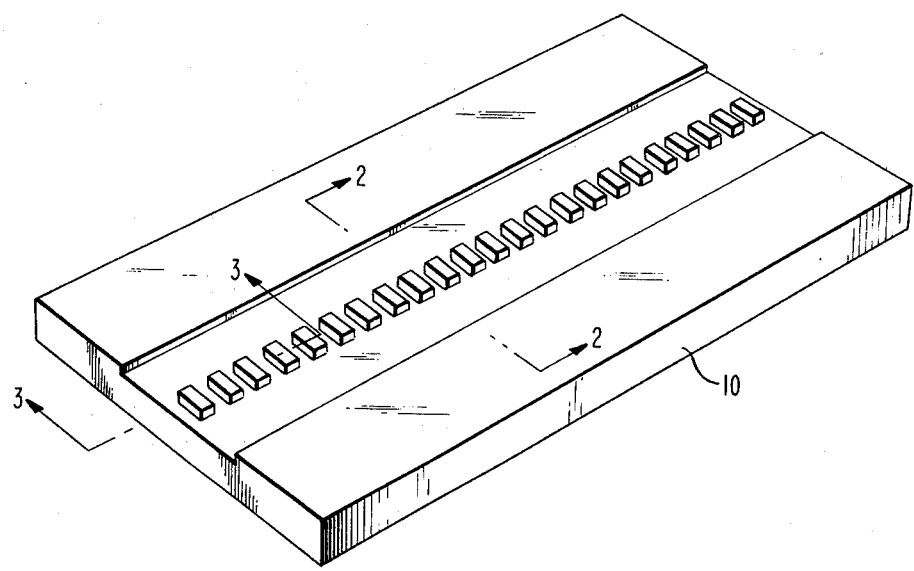
FIG. 1 is a pictorial view of a semiconductor laser constructed in accordance with the present invention.

After ion milling part way through the indium phosphide cladding layer 24, an $HCl$-$H_3PO_4$ stop etch is used to remove the remainder of the indium phosphide cladding layer 24 up to the quaternary buffer layer 23. This process produces well-defined teeth in the crenelated ridge structure with near vertical walls giving an appearance for each semiconductor laser 10 of the type illustrated in FIG. 1. The titanium mask is then removed with an HF acid etch.

Next a 0.3 micrometer thick silicon dioxide insulating layer 26 is sputtered over the entire surface taking care to cover all of the exposed sides of the teeth and the exposed quaternary buffer layer 23. Then a photoresist mask is created with windows over the tops of each of the teeth in the crenelated ridge structure. A plasma etch is used to remove the insulating layer in the windows. The photoresist is then washed away with solvent. A Ti-Sn layer is evaporated over the $SiO_2$ layer 26 and a thin gold layer is then evaporated over the Ti-Sn layer to create electrode 27. Finally an Au-Sn electrode is coated over the bottom surface of the wafer and alloyed thereby creating electrode 28 on the bottom surface of the wafer, and an electroplated gold pad (not shown in the drawing) approximately 10 micrometers thick is deposited over the entire electrode structure 27 in FIG. 1.

Figure 3:
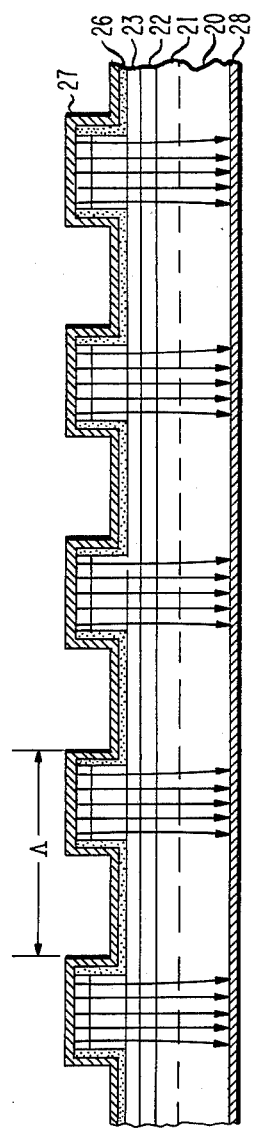

The above steps establish an alloyed contact only at the topmost parts of the crenelated ridge as illustrated in FIGS. 2 and 3 of the drawing. Accordingly when current is applied to the resulting semiconductor, laser current will only flow in those regions along the length of the laser that are beneath the topmost portions of the crenelated ridge as illustrated in FIG. 3. As a result, the laser is pumped at periodic spatial regions along the length of the laser, and the laser is encouraged to operate only in the longitudinal modes whose amplitude maxima coincide with the pumped regions of the laser. This periodic pumping is unlike the distributed feedback lasers where the periodic variations in gain are in the order of a wavelength. In the present invention, this periodic variation in pumping has a periodicity which corresponds to a plurality of wavelengths. The periodic dielectric loading provided by the teeth can also contribute to the mode selectivity. The selectivity of this type of periodic structure and the method of selecting the particular periodicity can best be illustrated by the following mathematical analysis.

As indicated in FIG. 3 the current which pumps the semiconductor laser only flows at regions in the laser that correspond to the topmost portions of the ridge structure. Only those laser modes that have amplitudes coinciding with the current pumped regions, or, mathematically, coinciding with the spatial Fourier components of the pumped region, are likely to sustain oscillations in the laser cavity. Each ridge period $\Lambda$ will contain an integral number of half guide wavelengths when the condition above is satisfied. This fact can be expressed by the following equation:

$$\Lambda = m\lambda/2n \quad (1)$$

where $\lambda$ is the optical wavelength, n is the index of refraction of the active medium and m is an integer. In order to determine the change in wavelength that would occur for a different integral number of half guide wavelengths in each ridge period, the partial derivative of the wavelength $\lambda$ with respect to the integer m may be taken, thereby providing the relationship $$\partial\lambda/\partial m = \lambda^2/2n\Lambda \quad (2)$$

From Equation 2 a table can be constructed of the changes in wavelength that will occur for different values of period assuming that the number of wavelengths within the period changes by one, that is $\partial m = 1$, $\lambda = 1.55$ μm and n = 3.35.

| $\Lambda$ | $\partial\lambda$ |
| --- | --- |
| 5 μm | 720 Å |
| 10 μmm | 360 Å |
| 20 μm | 180 Å |

The indium gallium arsenide phosphide system has a gain width of about 150 Å. Assuming that the laser may be subjected to temperature variations of 40 degrees C. and that the gain peak can be shifted by about 4 Å/C, the peak can be tuned over a range of about 160 Å. Accordingly, the total lasing range for a laser in this material system is about 300 Å. As indicated in the above table using an electrode structure with a period of 5 μm, there is a rather low probability that the laser can be made to oscillate with a guide half-wavelength equal to a sub-harmonic of $\Lambda$. A ridge structure having a period of 20 micrometers on the other hand will certainly satisfy Eq. (1) once or twice somewhere within the range of lasing wavelengths. The period of 10 micrometers appears to be an optimum choice in that there is a (300/362=) 83 percent change of coincidence while the mode selectivity is double that for $\Lambda = 20$ μm. There is also sufficient spacing between adjacent longitudinal modes in this structure to insure that the laser will at most oscillate in a single longitudinal mode.

Ideally, the cleaved end-mirrors should occur at the mid-points of notches separated by the overall length L of the laser. Deviations of the cleave position by an integral number of half guide wavelengths is also permitted in the ideal case. As a practical matter, deviations of $\pm \lambda/8n$ from these ideal conditions should also give reasonable performance since the resolution of the selectivity is rather coarse. For the example given above, $\lambda/8n = 600$ Å and L is likely to vary by this amount from chip to chip due to the wander of the cleave.

It should be apparent to those skilled in the art that the above illustrated technique of choosing the proper period can be applied equally as well to other material systems by using the proper values for the wavelength, index of refraction, gain width and temperature tuning parameter.

What is claimed is:

1. In a ridge-type semiconductor laser comprising a substrate having a plurality of epitaxially grown layers one of which includes an active layer containing a pn-junction, a ridge structure epitaxially grown and fabricated on said plurality of epitaxial layers, and means for providing current to said pn-junction in said active layer, said current being confined in a lateral dimension by said ridge structure, characterized in that said ridge structure is notched in regions at longitudinal periodic intervals, and said means for providing current couples said current into said active layer only in regions corresponding to the portions of said ridge that are not notched.

2. A ridge-type semiconductor laser structure as defined in claim 1 wherein said means for providing current comprises a pair of electrodes disposed along said structure on opposite sides of said pn-junction, and wherein an insulating layer is included between the notched regions and the electrode disposed along said ridge structure so as to confine current to the portions of said ridge that are not notched.

3. A ridge-type semiconductor laser as defined in claim 2 wherein said active layer is comprised primarily of indium, gallium, arsenic and phosphorus and said ridge includes a layer of indium phosphide in contact with said plurality of epitaxial layers.

4. In a semiconductor laser comprising a substrate of one type conductivity having an epitaxially grown layer of the same conductivity on one surface and an electrode on an opposite surface, an active layer epitaxially grown with a pn-junction on said layer of said substrate, a buffer layer of opposite conductivity epitaxially grown on said active layer, a ridge of opposite conductivity epitaxially grown on said buffer layer and extending along the length of said semiconductor laser, and a second electrode alloyed to the top of said ridge, characterized in that said ridge is notched substantially to the level of said buffer layer at periodic intervals along the length of said laser.

5. A semiconductor laser as defined in claim 4 wherein said ridge is notched so as to create notched and unnotched regions in said ridge which have longitudinal cross sections that are substantially rectangular.

6. A semiconductor laser as defined in claim 5 wherein said notched regions and unnotched regions have approximately equal length.

7. A semiconductor laser as defined in claim 6 wherein the unnotched regions of said ridge includes an insulating layer between said buffer layer and said second electrode.

8. A semiconductor laser as defined in claim 4 wherein said ridge is notched with a period $\Lambda$, the active layer is composed of materials that operate at a wavelength $\lambda$, and $\Lambda$ is approximately equal to an integral multiple of one-half guide wavelengths in the active layer.

* * * * *